(12) United States Patent
Lee et al.

(10) Patent No.: US 8,698,162 B2
(45) Date of Patent: Apr. 15, 2014

(54) GALLIUM NITRIDE BASED SEMICONDUCTOR DEVICES AND METHODS OF MANUFACTURING THE SAME

(75) Inventors: Jae-hoon Lee, Suwon-si (KR); Ki-se Kim, Suwon-si (KR)

(73) Assignee: Samsung Electronics Co., Ltd., Seoul (KR)

( * ) Notice: Subject to any disclaimer, the term of this patent is extended or adjusted under 35 U.S.C. 154(b) by 59 days.

(21) Appl. No.: 13/223,847

(22) Filed: Sep. 1, 2011

(65) Prior Publication Data

US 2012/0061680 A1 Mar. 15, 2012

(30) Foreign Application Priority Data

Sep. 14, 2010 (KR) .................. 10-2010-0089918

(51) Int. Cl.
*H01L 29/15* (2006.01)
*H01L 31/0256* (2006.01)

(52) U.S. Cl.
USPC ....... 257/76; 257/192; 257/E29.246; 438/167

(58) Field of Classification Search
USPC .............. 257/E29.246, 76, 77, 183–194, 257/E29.248; 438/149–167
See application file for complete search history.

(56) References Cited

U.S. PATENT DOCUMENTS

| | | | |
|---|---|---|---|
| 6,849,882 B2* | 2/2005 | Chavarkar et al. ............ | 257/191 |
| 7,354,782 B2 | 4/2008 | Mishra et al. | |
| 7,442,569 B2 | 10/2008 | Lee et al. | |
| 8,441,030 B2* | 5/2013 | Beach ............................ | 257/109 |
| 2008/0073652 A1* | 3/2008 | Sugimoto et al. ............... | 257/76 |
| 2009/0072272 A1 | 3/2009 | Suh et al. | |
| 2009/0189186 A1 | 7/2009 | Tanabe et al. | |
| 2009/0194773 A1 | 8/2009 | Hanson et al. | |
| 2009/0267188 A1 | 10/2009 | Piner et al. | |
| 2010/0140660 A1 | 6/2010 | Wu et al. | |
| 2010/0155741 A1 | 6/2010 | Ohki et al. | |
| 2010/0264461 A1* | 10/2010 | Rajan et al. .................... | 257/194 |

FOREIGN PATENT DOCUMENTS

| | | |
|---|---|---|
| JP | 2008-270310 | 11/2008 |
| KR | 10-2008-0002644 A | 1/2008 |
| WO | 2007/081964 A2 | 7/2007 |
| WO | WO 2007/136401 A2 | 11/2007 |

OTHER PUBLICATIONS

Extended European Search Report issued in European Patent Application No. EP 11180488.6 dated Jun. 28, 2013.
Yi-Feng Wu et al., "Very-High Power Density AlGaN/GaN HEMTs," IEEE Transactions on Electronic Devices, vol. 48, No. 3, Mar. 2001.

* cited by examiner

*Primary Examiner* — Sonya D McCall Shepard
(74) *Attorney, Agent, or Firm* — McDermott Will & Emery LLP

(57) ABSTRACT

Gallium nitride (GaN) based semiconductor devices and methods of manufacturing the same. The GaN-based semiconductor device may include a heat dissipation substrate (that is, a thermal conductive substrate); a GaN-based multi-layer arranged on the heat dissipation substrate and having N-face polarity; and a heterostructure field effect transistor (HFET) or a Schottky electrode arranged on the GaN-based multi-layer. The HFET device may include a gate having a double recess structure. While such a GaN-based semiconductor device is being manufactured, a wafer bonding process and a laser lift-off process may be used.

8 Claims, 13 Drawing Sheets ically dissipate heat, is advantageous in terms of improving a voltage withstanding characteristic, and has excellent operating characteristics.

Example embodiments of the present invention also provide methods of manufacturing the GaN-based semiconductor devices.

GALLIUM NITRIDE BASED SEMICONDUCTOR DEVICES AND METHODS OF MANUFACTURING THE SAME

CROSS-REFERENCE TO RELATED PATENT APPLICATION

This application claims the benefit of Korean Patent Application No. 10-2010-0089918, filed on Sep. 14, 2010, in the Korean Intellectual Property Office, the disclosure of which is incorporated herein in its entirety by reference.

BACKGROUND

1. Field

The present disclosure relates to semiconductor devices and methods of manufacturing the same, and more particularly, to gallium nitride based semiconductor devices and methods of manufacturing the same.

2. Description of the Related Art

Recently, along with rapid developments in information and communication technologies, technologies for high-speed and massive-capacity signal transmission are being rapidly developed. In this regard, with an increasing demand for personal mobile phones, satellite communications, military radars, broadcasting communications, and communication relay devices, there has been an increasing request for high-speed and high-power electronic devices which are required for high-speed telecommunication systems using microwave and millimetric wave bands. Power devices for controlling relatively high levels of power are used for various purposes in many fields including communication fields, and various types of research are being conducted thereon.

A gallium nitride (GaN) based semiconductor has excellent material properties, such as a large energy gap, high thermal and chemical stability, high electron saturation speed (~$3\times10^7$ cm/sec), etc., and thus a GaN-based semiconductor may be applied not only to an optical device, but also a high frequency and high power electronic device. An electronic device employing a GaN-based semiconductor has various advantages, such as a high breakdown electric field (~$3\times10^6$ V/cm), high maximum current density, stable operation characteristics at high temperatures, high thermal conductivity, etc. In particular, in the case of a heterostructure field effect transistor (HFET) employing a GaN-based heterojunction structure, since band-discontinuity at a junction interface is large, electrons may be densely concentrated at the junction interface, and thus electron mobility may be further increased. Due to such a material property, a GaN-based semiconductor may be applied to a high power device.

However, since a GaN-based semiconductor device generally employs a sapphire substrate having relatively low thermal conductivity, a GaN-based semiconductor device does not have an excellent heat dissipation characteristic. Although a SiC substrate may be used instead of a sapphire substrate for an improved heat dissipation characteristic, a SiC substrate is relatively expensive (about 10 times more expensive than a sapphire substrate), and thus the overall cost for manufacturing a GaN-based semiconductor device increases. Furthermore, in the case of using a GaN-based semiconductor device as a power device, there are various problems which are related to a voltage withstanding characteristic, manufacturing processes, etc.

SUMMARY

Example embodiments of the present invention provide gallium nitride base semiconductor devices, which may eas- According to an aspect of the present invention, a gallium nitride (GaN) based semiconductor device includes a heat dissipation substrate; a GaN-based multi-layer, which is arranged on the heat dissipation substrate, have N-face polarity, and include a 2-dimensional electron gas (2DEG); and a gate, a source, and a drain arranged on the GaN-based multi-layer.

The gate may have a planar-type structure.

The gate may have a double recess structure. In this case, a double recess region may be arranged in the GaN-based multi-layer, and the gate may be arranged in the double recess region.

The heat dissipation substrate may include a material having a higher thermal conductivity than a sapphire substrate.

The heat dissipation substrate may be one of an amorphous AlN substrate, a crystalline AlN substrate, a Si substrate, a Ge substrate, an amorphous SiC substrate, and a ceramic substrate.

The GaN-based multi-layer may includes an $Al_xGa_{1-x}N$ layer ($0.1 \leq x \leq 0.6$) arranged on the heat dissipation substrate; and an $Al_yGa_{1-y}N$ layer ($0 \leq y < 0.01$) arranged on the $Al_xGa_{1-x}N$ layer.

The GaN-based multi-layer may further include a highly resistive GaN-based material layer arranged between the heat dissipation substrate and the $Al_xGa_{1-x}N$ layer.

The highly resistive GaN-based material layer may have a resistance greater than or equal to $10^9$ Ω/sq.

According to an another aspect of the present invention, a gallium nitride (GaN) based semiconductor device includes a heat dissipation substrate; a GaN-based multi-layer, which is arranged on the heat dissipation substrate, have N-face polarity, and include a 2-dimensional electron gas (2DEG); a cathode which forms Schottky contact with a first region of the GaN-based multi-layer; and an anode which forms ohmic contact with a second region of the GaN-based multi-layer.

The heat dissipation substrate may include a material having a higher thermal conductivity than a sapphire substrate.

The heat dissipation substrate may be one of an amorphous AlN substrate, a crystalline AlN substrate, a Si substrate, a Ge substrate, an amorphous SiC substrate, and a ceramic substrate.

The GaN-based multi-layer may include an $Al_xGa_{1-x}N$ layer ($0.1 \leq x \leq 0.6$) arranged on the heat dissipation substrate; and an $Al_yGa_{1-y}N$ layer ($0 \leq y < 0.01$) arranged on the $Al_xGa_{1-x}N$ layer.

The GaN-based multi-layer may further include a highly resistive GaN-based material layer arranged between the heat dissipation substrate and the $Al_xGa_{1-x}N$ layer.

The highly resistive GaN-based material layer may have a resistance greater than or equal to $10^9$ Ω/sq.

According to an another aspect of the present invention, a method of manufacturing gallium nitride (GaN) based semiconductor device, the method includes forming a GaN-based first layer on a first substrate; attaching a second substrate to the first layer; removing the first substrate; forming a GaN-based second layer having N-face polarity on a surface of the first layer exposed by removing the first substrate; forming a GaN-based third layer having N-face polarity and including 2-dimensional electron gas (2DEG) on the second layer; and forming a semiconductor device using the third layer as a channel layer.

The semiconductor device may have a heterostructure field effect transistor (HFET) structure including a gate, a source, and a drain.

The method may further include forming a double recess region in the third layer, wherein the gate may be formed in the double recess region.

The semiconductor device may have a Schottky diode structure including a cathode and an anode.

The first substrate may be a sapphire substrate.

The second substrate may include a material having a higher thermal conductivity than the first substrate.

The first substrate may be removed by using a laser lift-off method.

After the step of removing the first substrate, the method may further include removing a portion of the first layer from an exposed surface thereof; and re-growing a material layer identical or similar to the first layer on the remaining first layer. The second layer and the third layer may be sequentially formed on the re-grown material layer.

The first layer may be formed of a highly resistive GaN-based material.

The second layer may be formed of $Al_xGa_{1-x}N$ layer ($0.1 \leq x \leq 0.6$).

The third layer may be formed of $Al_yGa_{1-y}N$ layer ($0 \leq y < 0.01$).

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Figure 1:
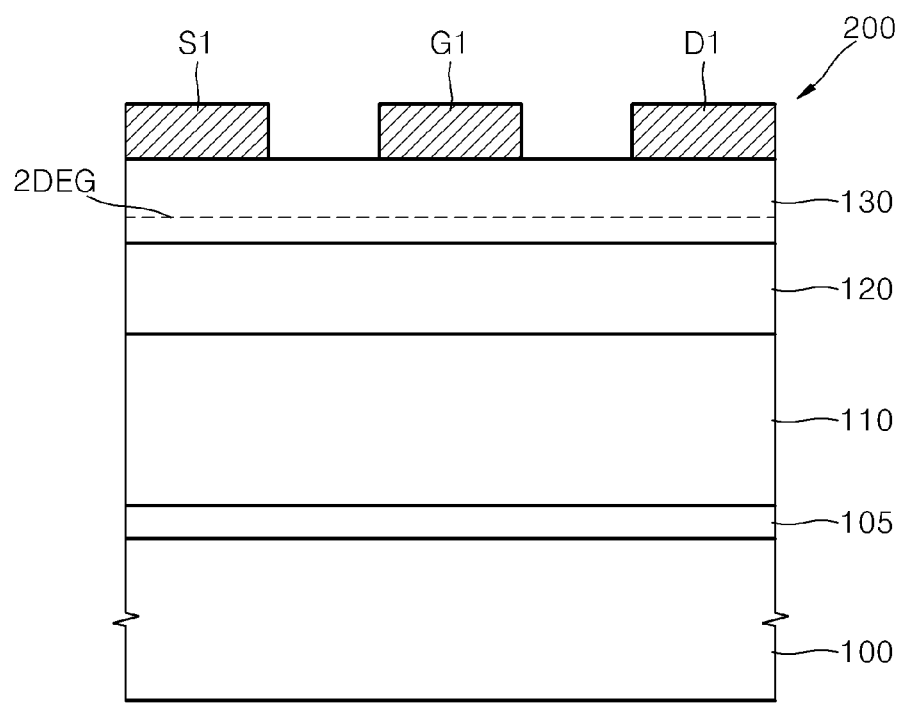
FIG. 1 is a sectional view of a gallium nitride (GaN) based semiconductor device according to an embodiment of the present invention.

Various example embodiments will now be described more fully with reference to the accompanying drawings in which exemplary embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the exemplary embodiments.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the exemplary embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, the exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from an implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the exemplary embodiments.

Unless otherwise defined, all terms (including technical and scientific terms) used herein have the same meaning as commonly understood by one of ordinary skill in the art to which the exemplary embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, gallium nitride (GaN) based semiconductor devices and methods of manufacturing the same, according to embodiments of the present invention, will be described in detail. In the drawings, the thicknesses of layers and regions are exaggerated for clarity. Like reference numerals in the drawings denote like elements, and thus their description will be omitted.

FIG. 1 shows a gallium nitride (GaN) based semiconductor device according to an embodiment of the present invention.

Referring to FIG. 1, a heterostructure field effect transistor (HFET) device 200 is arranged on a heat dissipation substrate 100. The heat dissipation substrate 100 may be a thermal conductive substrate having higher thermal conductivity than a sapphire substrate, and may be a substrate less expensive than a single crystalline SiC substrate. For example, the heat dissipation substrate 100 may be an amorphous or a crystalline AlN substrate. However, other substrates aside from the AlN substrate, e.g., a Si substrate, a Ge substrate, an amorphous SiC substrate, and a ceramic substrate, may be used as the heat dissipation substrate 100.

A bonding layer 105 may be arranged on the heat dissipation substrate 100. The bonding layer 105 may be a silicon oxide layer, for example. The bonding layer 105 may be provided selectively (optionally). That is, the bonding layer 105 may or may not be provided. GaN-based layers 110, 120, and 130 may be stacked on the bonding layer 105. For example, a GaN-based first layer 110, a GaN-based second layer 120, and a GaN-based third layer 130 may be sequentially arranged on the bonding layer 105. The first layer 110 is a layer containing GaN and may be a semi-insulating layer having a higher resistance than a general semiconductor. The first layer 110 may be an undoped GaN layer or a GaN layer doped with an impurity, such as Mg, Zn, C, Fe, etc., and a sheet resistance of the first layer 110 may be greater than or equal to about $10^9$ Ω/sq, for example. In the case where the first layer 110 is formed as an undoped GaN layer with a high resistance, problems due to out-diffusion of an impurity during operation of a GaN-based semiconductor device may be prevented. A method of increasing the resistance of the first layer 110 without doping the first layer 110 with Mg, Zn, C, or Fe will be described later. When the first layer 110 has a high resistance (that is, a semi-insulation property), leakage of currents through the first layer 110 may be suppressed/prevented, and thus characteristics of a GaN-based semiconductor device may be easily enhanced. Furthermore, the first layer 110 may have N-face polarity. Detailed description of N-face polarity will be given later.

The second layer 120 may be an $Al_xGa_{1-x}N$ layer (here, $0.1 \leq x \leq 0.6$) having N-face polarity. The thickness of the second layer 120 may be from about 20 nm to 50 nm. The third layer 130 may be an $Al_yGa_{1-y}N$ layer (here, $0 \leq y < 0.01$). In other words, the third layer 130 may be a GaN layer doped with Al at less than about 1%. In the case where the third layer 130 is doped with Al, not only a carrier (electrons) concentration of the third layer 130 increases, but also the crystallinity of the third layer 130 may be improved. Therefore, characteristics of a GaN-based semiconductor device may be improved. The thickness of the third layer 130 may be from about 10 nm to about 500 nm. Similar to the second layer 120, the third layer 130 may have N-face polarity. A 2-dimensional electron gas layer (referred to hereinafter as a 2DEG layer) may exist near an interface of the third layer 130 contacting the second layer 120. The third layer 130 may be regarded as a channel layer.

A gate electrode G1 may be arranged on the third layer 130, and a source electrode S1 and a drain electrode D1 may be arranged at two opposite sides of the gate electrode G1. The gate electrode G1 may form Schottky contact with the third layer 130, whereas the source electrode S1 and the drain electrode D1 may form ohmic contact with the third layer 130. If required, a Schottky contact layer (not shown) may be arranged between the gate electrode G1 and the third layer 130, and ohmic contact layers (not shown) may be arranged between the source electrode S1 and the third layer 130 and between the drain electrode D1 and the third layer 130, respectively. In the case of using the Schottky contact layer and the ohmic contact layers, the gate electrode G1 and the source/drain electrodes S1 and D1 may be formed of a same material. The source/drain electrodes S1 and D1 may include at least one of Ni, Ti, TiN, Pt, Au, $RuO_2$, V, W, WN, Hf, HfN, Mo, NiSi, $CoSi_2$, WSi, PtSi, Ir, Zr, Ta, TaN, Cu, Ru, Co, and a combination thereof. Furthermore, although not shown, a gate insulation layer may be further arranged between the gate electrode G1 and the third layer 130. In this case, the gate electrode G1 does not form Schottky contact with the third layer 130. In other words, the gate electrode G1 does not have to form Schottky contact with the third layer 130, a greater number of materials may be used to constitute the gate electrode G1 as compared to the case of using Schottky contact. Furthermore, the gate electrode G1 and the source/drain electrodes S1 and D1 may be formed of a same material. A passivation layer (not shown) which covers the gate electrode G1 and the source/drain electrodes S1 and D1 may be further arranged on the third layer 130. The passivation layer may have a single layer structure or a multi-layer structure including a silicon nitride layer, a silicon oxide layer, etc., for example.

In the GaN-based semiconductor device as described above, it may be considered that the first layer 110, the second layer 120, the third layer 130, the gate electrode G1, and the source/drain electrodes S1 and D1 constitute the HFET device 200. Since the HFET device 200 is formed on a GaN-based multi-layer including the first, second, and third layers 110, 120, and 130 having N-face polarity, the HFET device 200 may be considered as an N-face HFET device.

Hereinafter, N-face polarity and Ga-face polarity will be described with reference to FIG. 2.

Figure 2:
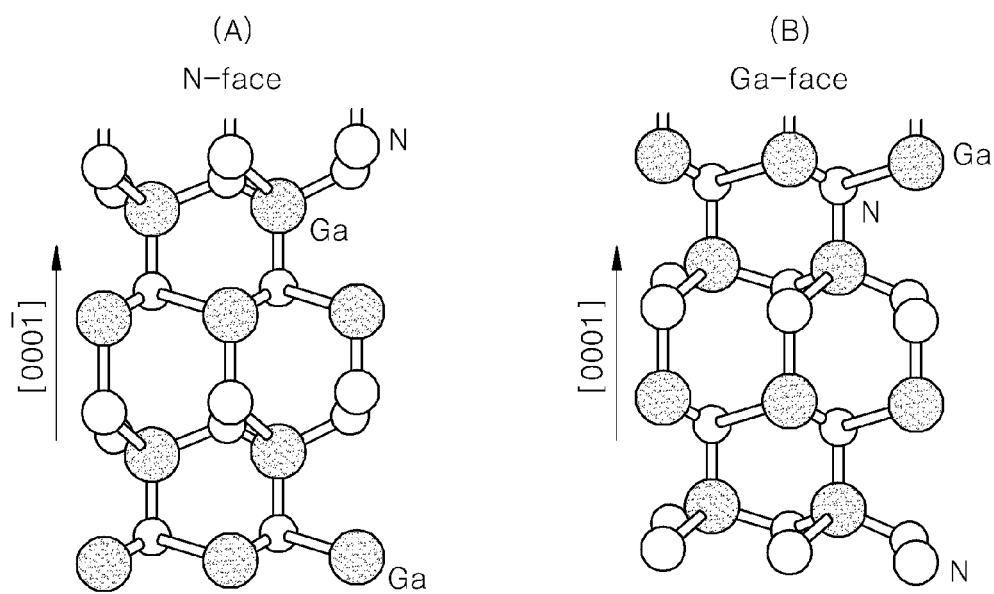
FIG. 2 is a diagram showing crystalline structures of a GaN layer having N-face polarity and a GaN layer having Ga-face polarity.

(A) and (B) of FIG. 2 show crystalline structures of a GaN layer having N-face polarity and a GaN layer having Ga-face polarity, respectively.

Referring to FIG. 2, a GaN layer having Wurzite structure may have N-face polarity in which N atoms are arranged on the topmost layer (an exposed surface) as shown in (A) or Ga-face polarity in which Ga atoms are arranged on the topmost layer (an exposed surface) as shown in (B). The GaN layer having an N-face may have [000-1] directivity in the Z-axis direction, whereas the GaN layer having a Ga-face may have directivity in the Z-axis direction.

Furthermore, in a GaN-based heterojunction structure, e.g., a GaN/AlGaN structure, a location at which the 2DEG layer is to be formed may vary according to surface polarities of a GaN layer and an AlGaN layer. Detailed description thereof will be given below with reference to FIG. 3.

Figure 3:
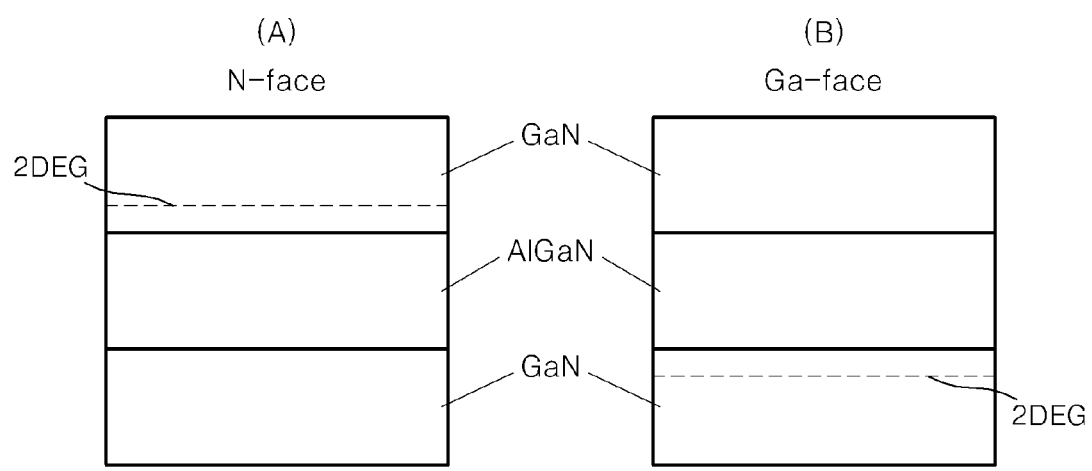
FIG. 3 is a diagram showing positions of 2-dimensional electron gas (2DEG) layers according to surface polarities of GaN-based heterojunction structures.

Referring to (A) of FIG. 3, if GaN/AlGaN/GaN layers have N-face polarity, the 2DEG layer may be formed in the GaN layer disposed on the AlGaN layer. Referring to (B) of FIG. 3, if the GaN/AlGaN/GaN layers have Ga-face polarity, the 2DEG layer may be formed in the GaN layer disposed under the AlGaN layer. As described above, according to surface polarity of a GaN-based material layer (multi-layer), characteristics and configurations of devices formed therefrom may vary.

According to embodiments of the present invention, various advantages may be acquired by forming a device on a GaN-based material layer (multi-layer) having N-face polarity. In detail, a GaN-based material layer having N-face polarity may have better surface morphology than an AlGaN-based material layer. Therefore, a GaN-based material layer having N-face polarity may exhibit small surface current leakage and high mobility. Therefore, a GaN-based semiconductor device according to an embodiment of the present invention may have excellent electric properties.

Figure 4:
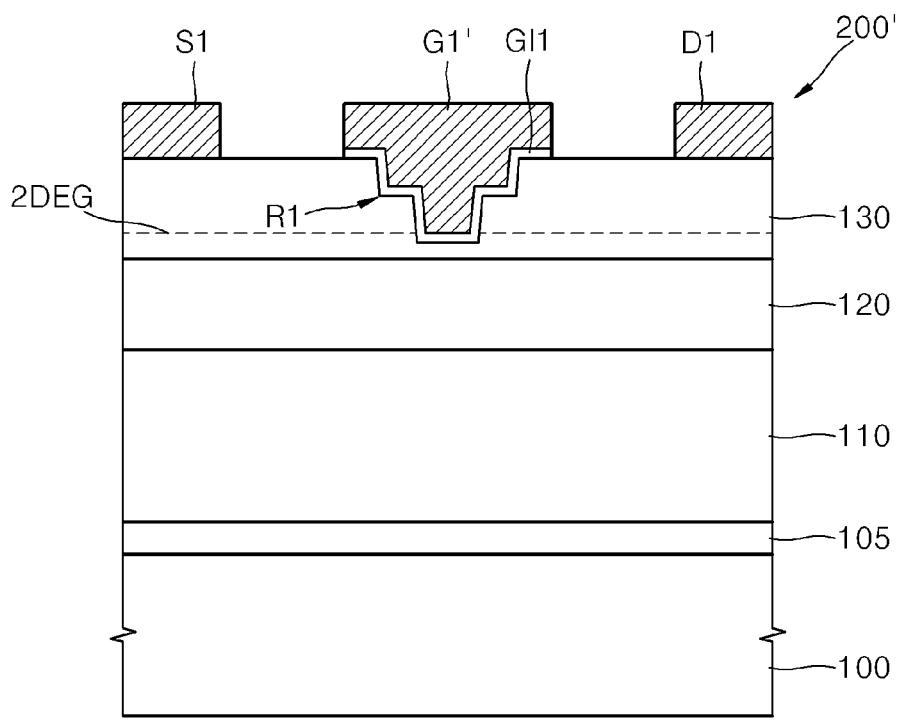
FIG. 4 is a sectional view of a GaN-based semiconductor device according to another embodiment of the present invention.

FIG. 4 shows a GaN-based semiconductor device according to another embodiment of the present invention. The present embodiment is a modification of the embodiment shown in FIG. 1.

Referring to FIG. 4, a gate electrode G1' may have a recessed gate structure. In other words, a recess region R1 may be arranged in the third layer 130, and the gate electrode G1' may be arranged in the recess region R1. The gate electrode G1' may have a double recessed gate structure. In other words, the recess region R1 may have a double recess structure, and the gate electrode G1' may be arranged thereon. The reference numeral Gl1 denotes a gate insulation layer formed in the recess region R1. The gate insulation layer Gl1 may contain at least one of $Al_2O_3$, $SiO_x$, $Si_xN_y$, $Sc_2O_3$, AlN, $Ga_2O_3$, $Gd_2O_3$, $Al_xGa_{2(1-x)}O_3$, MgO, and a combination thereof. Although not stated herein, any of gate insulation layer materials used in transistors may be applied to the gate insulation layer Gl1. In FIG. 4, configurations other than the recess region R1, the gate electrode G1', and the gate insulation layer Gl1 may be identical to those of FIG. 1. Therefore, the device shown in FIG. 4 may be considered as an N-face HFET device 200' having a recess gate structure, arranged on the heat dissipation substrate 100.

As shown in FIG. 4, when the gate electrode G1' has a recessed gate structure, electric characteristics of the 2DEG layer may be changed by the gate electrode G1', and an effective channel length between the source electrode S1 and the drain electrode D1 may increases, and thus voltage withstanding characteristic of the HFET device 200' may be strengthened. Particularly, if the recess region R1 has a double recess structure, it may be more advantageous for strengthening a voltage withstanding characteristic. If the recess region R1 has a single recess structure, an electric field may be concentrated at the recess region R1, and thus the breakdown voltage may be lowered. However, if the recess region R1 is formed to have a double recess structure as in the present embodiment, concentration of an electric field may be reduced, and thus the recess region R1 having the double recess structure may be more advantageous for strengthening a voltage withstanding characteristic.

Although FIG. 4 shows that the recess region R1 is formed to have a depth not reaching the interface between the third layer 130 and the second layer 120, a range (depth) of forming the recess region R1 may vary. For example, the recess region R1 may be formed so as to reach the interface between the third layer 130 and the second layer 120 or may be formed to penetrate the third layer 130 and to extend into the second layer 120. The threshold voltage of the HFET device 200' may vary according to a depth of the recess region R1. For example, as the recess region R1 is formed to have a greater depth, the threshold voltage of the HFET device 200' may increase in the positive direction. Therefore, it may be easy to embody a normally off type device.

Since the GaN-based semiconductor device according to the present embodiment as described above is arranged on the heat dissipation substrate 100, the GaN-based semiconductor device may have an excellent heat dissipation characteristic. Furthermore, when the gate electrode G1' has a double recess structure, the voltage withstanding characteristic of the GaN-based semiconductor device may be enhanced.

FIGS. 5A through 5H show a method of manufacturing a GaN-based semiconductor device according to an embodiment of the present invention.

Figure 5A:
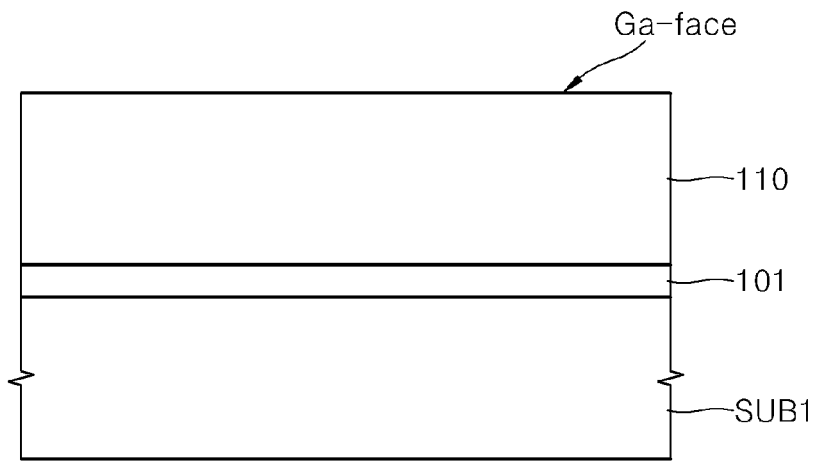
FIGS. 5A through 5H are sectional views showing a method of manufacturing a GaN-based semiconductor device according to an embodiment of the present invention.

Referring to FIG. 5A, a GaN-based first layer 110 having Ga-face polarity may be formed on a first substrate SUB1. The first substrate SUB1 may be, for example, a sapphire substrate. Since there is no substrate having a lattice constant and thermal expansion coefficient identical to those of a GaN-based material, a GaN-based material is generally grown on a sapphire substrate. Before the first layer 110 is formed, a buffer layer 101 may be formed on the first substrate SUB1, and then the first layer 110 may be formed thereon. The buffer layer 101 may be arranged to prevent deterioration of crystallinity of the first layer 110 by reducing differences in the lattice constants and the thermal expansion coefficients between the first substrate SUB1 and the first layer 101. The buffer layer 101 may be formed of GaN or SiC, for example.

The first layer 110 is a layer containing GaN, and may be a semi-insulating layer having a higher resistance than a general semiconductor. The first layer 110 may be an undoped GaN layer or a GaN layer doped with an impurity, such as Mg, Zn, C, Fe, etc., and a sheet resistance of the first layer 10 may be greater than or equal to about $10^9$ Ω/sq, for example. A method of forming the first layer 110 to have a high resistance without doping the first layer 110 with Mg, Zn, C, or Fe will be briefly described below. After the buffer layer 101 is grown, a grain size of the buffer layer 101 may become relatively small by thermally treating (annealing) the grown buffer layer 101 at a temperature from about 900° C. to about 950° C. for several minutes. When a GaN thin-film (that is, the first layer 110) is grown on such a buffer layer 101 having a small grain size and high density, a Ga vacancy that is capable of trapping electrons is formed, and thus the first layer 110 may have a high resistance without being doped with an impurity. Here, a temperature for growing the GaN thin-film (that is, the first layer 110) may be from about 1020° C. to about 1050° C. During a period for raising temperature from the temperature for thermally treating the buffer layer 101 to the temperature from about 1020° C. to about 1050° C. (that is, a temperature raising period), the growing process of the GaN thin-film (that is, the first layer 110) may be performed. In this manner, an undoped GaN layer having a high resistance (that is, the first layer 110) may be obtained. However, a method of forming the first layer 110 is not limited thereto, and various modifications may be made thereto.

Figure 5B:
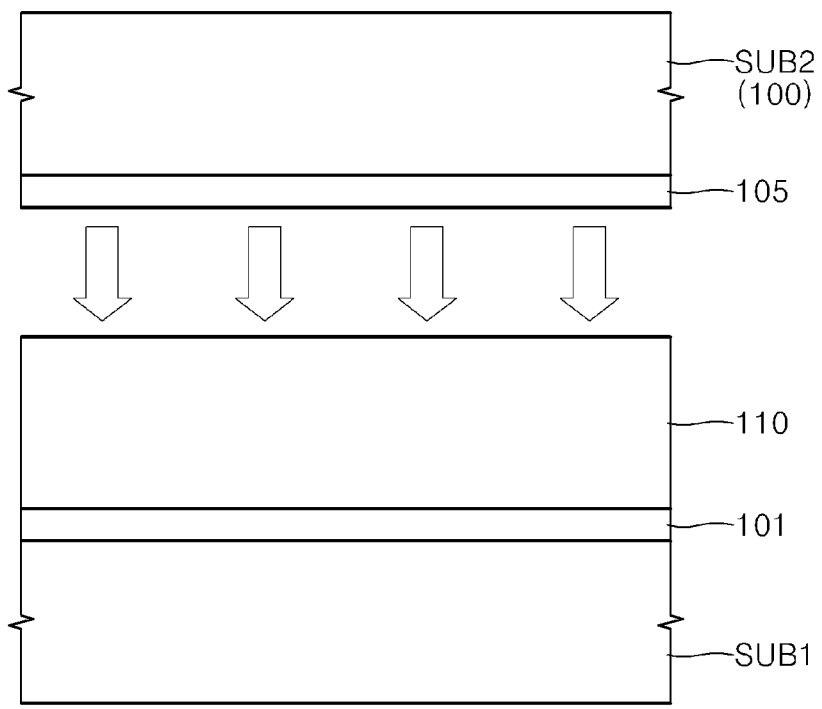
Figure 5C:
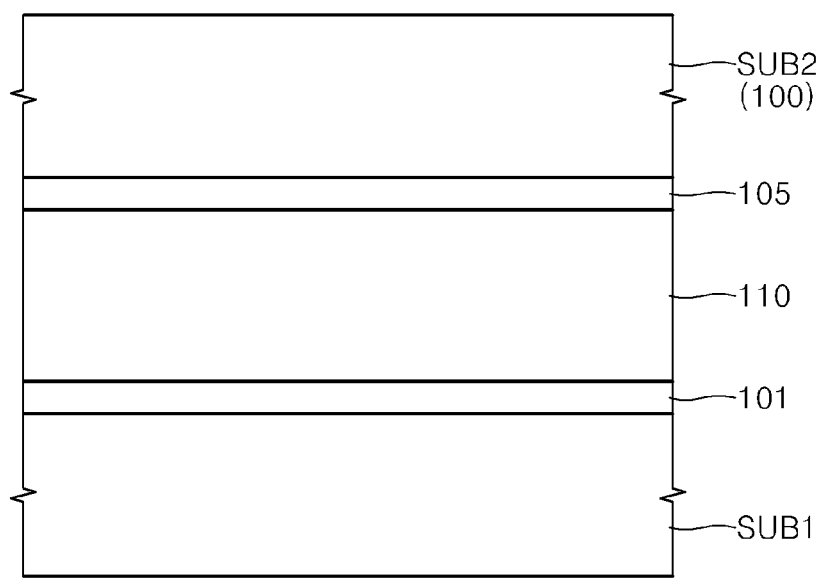

Referring to FIGS. 5B and 5C, a second substrate SUB2 may be attached to the top surface of the first layer 110. After a bonding layer 105 is formed on the bottom surface of the second substrate SUB2, the second substrate SUB2 may be attached to the first layer 110 via the bonding layer 105. The bonding layer 105 may be formed of silicon oxide, for example. The bonding layer 105 may be arranged on the top surface of the first layer 110, instead of the bottom surface of the second substrate SUB2. The second substrate SUB2 may correspond to the heat dissipation substrate 100 of FIG. 1. That is, the second substrate SUB2 may be a thermal conductive substrate having higher thermal conductivity than the first substrate SUB1 (e.g., a sapphire substrate). The second substrate SUB2 may be less expensive than a single crystalline SiC substrate. For example, the second substrate SUB2 may be an amorphous or a crystalline AlN substrate. However, other substrates aside from the AlN substrate, e.g., a Si substrate, a Ge substrate, an amorphous SiC substrate, and a ceramic substrate, may be used as the second substrate SUB2.

Figure 5D:
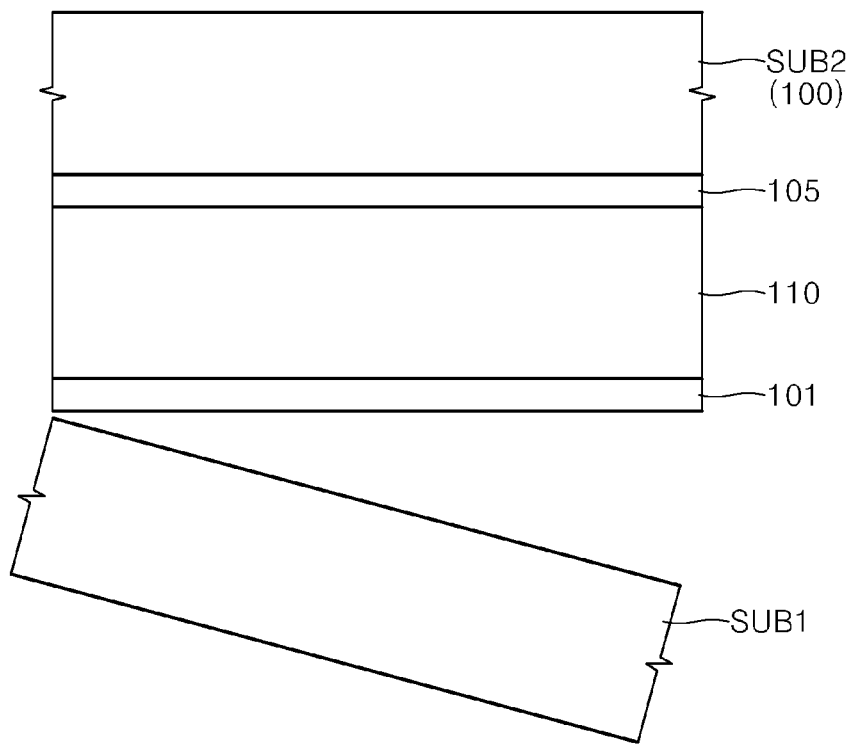

Referring to FIG. 5D, the first substrate SUB1 may be removed. The first substrate SUB1 may be removed by using a laser lift-off method, for example. Since the laser lift-off method is well-known in the art, a detailed description thereof will be omitted.

After the buffer layer 101 is removed, a stacked structure including the first layer 110, the bonding layer 105, and the second substrate SUB2 may be turned upside down. A result thereof is shown in FIG. 5E.

Figure 5E:
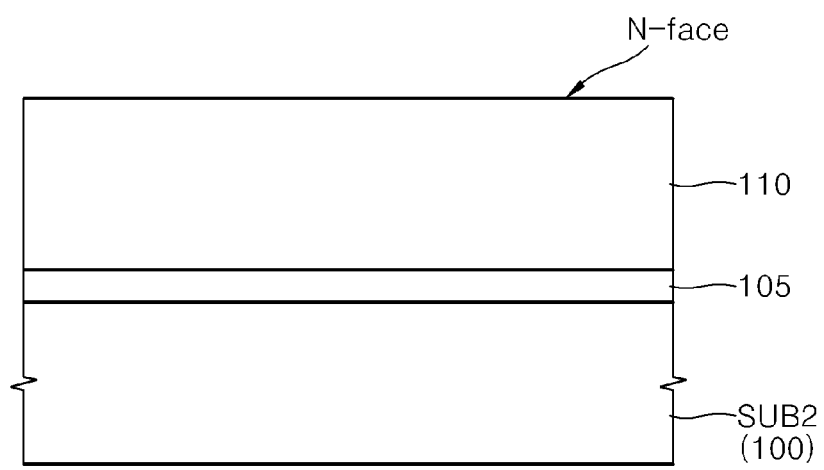

The stacked structure including the second substrate SUB2, the bonding layer 105, and the first layer 110 of FIG. 5E corresponds to the stacked structure including the first layer 110, the bonding layer 105, and the second substrate SUB2 of FIG. 5D that is turned upside down. Therefore, the first layer 110 of FIG. 5E has N-face polarity.

Figure 5F:
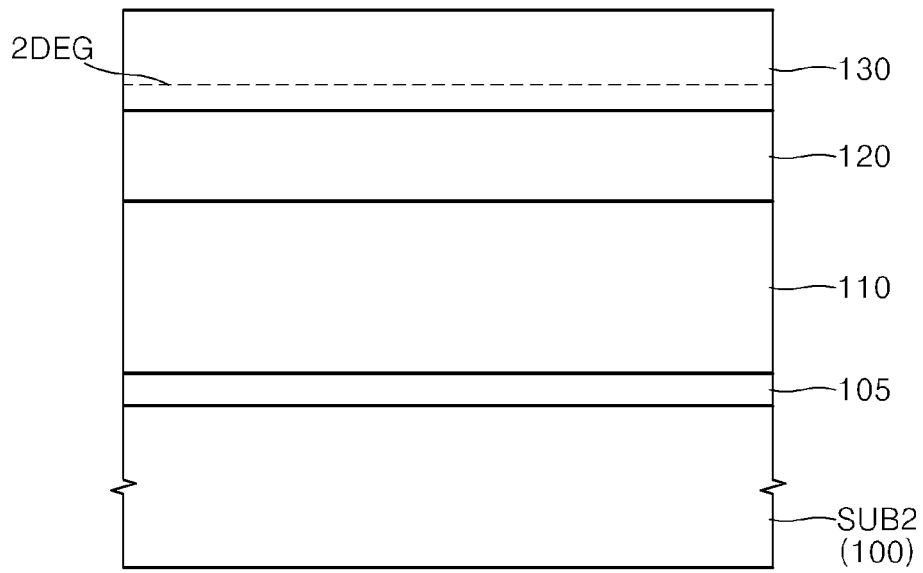

Referring to FIG. 5F, the GaN-based second layer 120 and the GaN-based third layer 130 may be sequentially formed on the top surface (N-face) of the first layer 110. Since the first layer 110 has N-face polarity, the second layer 120 and the third layer 130 may be formed to have N-face polarity. The second layer 120 may be an $Al_xGa_{1-x}N$ layer (here, $0.1 \leq x \leq 0.6$) having N-face polarity, and the thickness of the second layer 120 may be from about 20 nm to 50 nm. The third layer 130 may be an $Al_yGa_{1-y}N$ layer (here, $0 \leq y < 0.01$). In other words, the third layer 130 may be a GaN layer doped with Al at less than about 1%. The thickness of the third layer 130 may be from about 10 nm to about 500 nm. The 2DEG layer may exist near an interface of the third layer 130 contacting the second layer 120. The third layer 130 may be regarded as a channel layer.

Figure 5G:
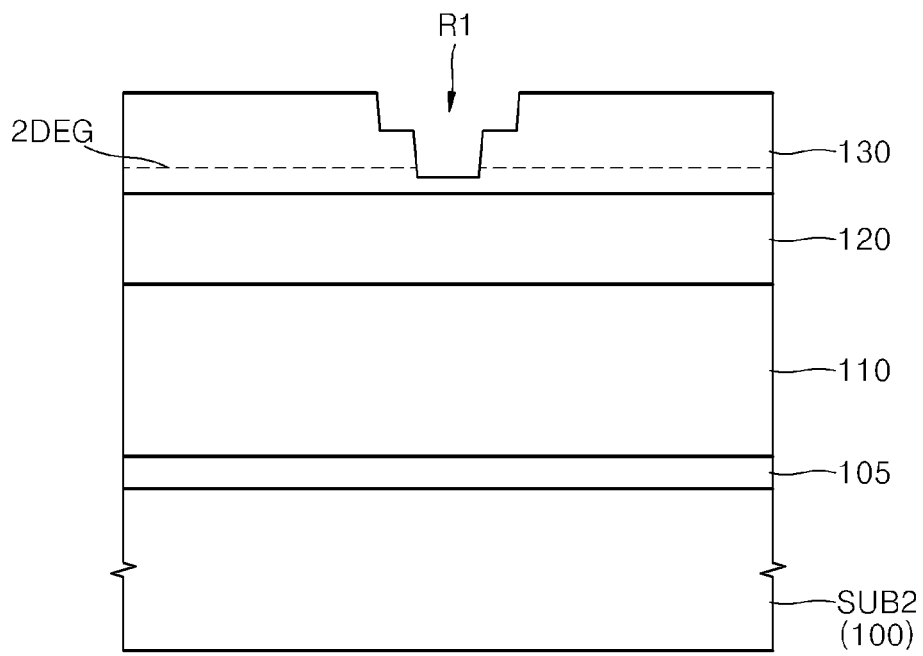

Referring to FIG. 5G, a recess region R1 may be formed by partially etching the third layer 130. The recess region R1 may be formed to have a double recess structure. In other words, the recess region R1 may be formed, such that a lower portion of the recess region R1 has a first width, whereas an upper portion of the recess region R1 has a second width larger than the first width. Any of various methods/operations may be applied to form the recess region R1. For example, instead of forming the recess region R1 by forming the third layer 130 and partially etching the third layer 130, the recess region R1 may be formed while the third layer 130 is being deposited. In this case, during formation of the third layer 130, the recess region R1 may be formed at portions covered by two mask patterns having different sizes. Furthermore, a depth/range of the recess region R1 is not limited to those shown in FIG. 5G. In other words, as described above with reference to FIG. 4, the depth/range of the recess region R1 may vary. For example, the recess region R1 may be formed so as to reach the interface between the third layer 130 and the second layer 120 or may be formed to penetrate the third layer 130 and to extend into the second layer 120.

Figure 5H:
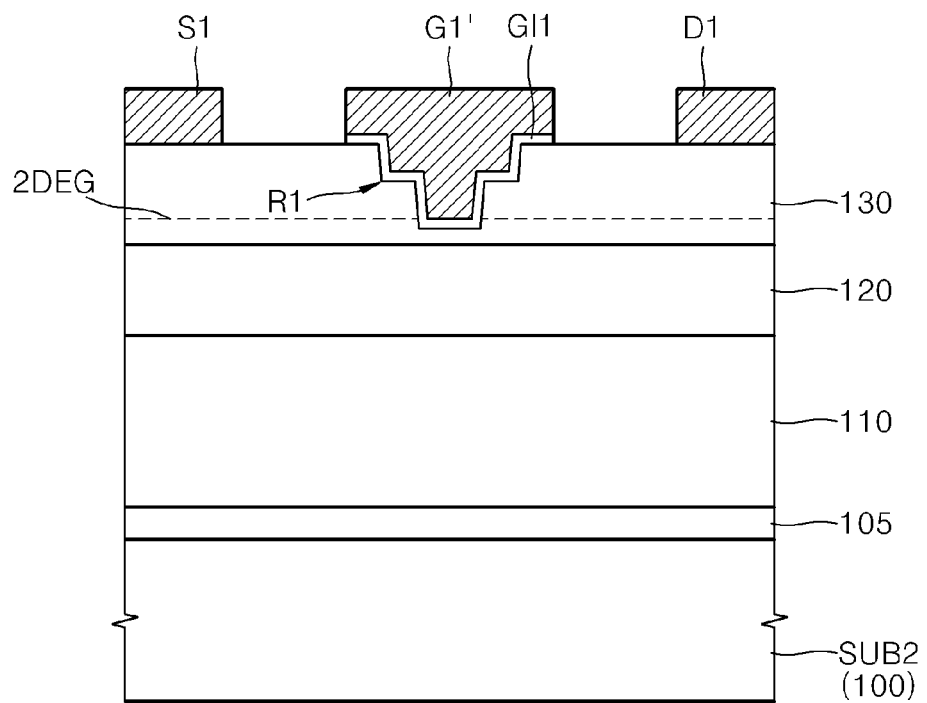

Referring to FIG. 5H, a gate insulation layer GI1 and a gate electrode G1' may be formed in the recess region R1. Therefore, the gate electrode G1' may have double recess structure. A source electrode S1 and a drain electrode D1 may be formed on portions of the third layer 130 at two opposite sides of the gate electrode G1'. Before the source electrode S1 and the drain electrode D1 are formed, the surface (top surface) of the third layer 130 may be laser-treated. Ohmic contacts between the third layer 130 and the source electrode S1 and the drain electrode D1 may be improved by the laser treatment. The laser treatment is an optional operation. Furthermore, although not shown, ohmic contact layers may be arranged between the source electrode S1 and the third layer 130 and between the drain electrode D1 and the third layer 130, respectively.

Next, although not shown, a passivation layer which covers the gate electrode G1' and the source/drain electrodes S1 and D1 may be formed on the third layer 130. The passivation layer may have a single layer structure or a multi-layer structure including at least one of a silicon nitride layer and a silicon oxide layer, for example.

Accordingly, a HFET structured GaN-based semiconductor device, which is arranged on a heat dissipation substrate (that is, the second substrate SUB2) and has an excellent heat dissipation characteristic and an improved voltage withstanding characteristic, may be easily manufactured.

Various modifications may be made in the manufacturing method described above. If the recess operation shown in FIG. 5G is not performed, and follow-up operations are performed on a planar third layer 130, a GaN-based semiconductor device having a planar gate electrode G1 as shown in FIG. 1 may be manufactured.

Figure 6A:
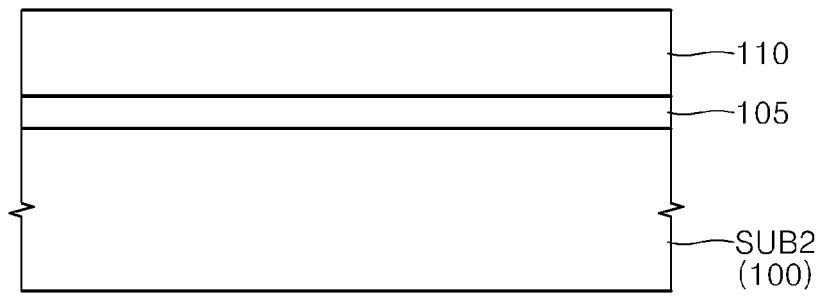
FIGS. 6A through 6C are sectional views showing parts of a method of manufacturing a GaN-based semiconductor device according to another embodiment of the present invention.

According to another embodiment of the present invention, the first layer 110 of FIG. 5E may be partially removed. A result thereof is shown in FIG. 6A. For partially removing the first layer 110, a chemical mechanical polishing (CMP) method, a dry etching method, or a wet etching method may be used. Here, the thickness of a removed portion of the first layer 110 may be less than or equal to several micrometers (μm).

Figure 6B:
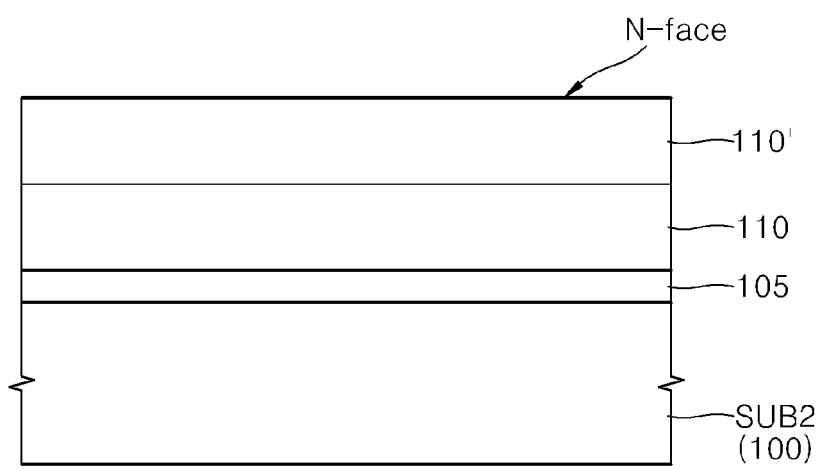

Next, as shown in FIG. 6B, a material layer 110' identical or similar to the first layer 110 may be re-grown on the remaining first layer 110. Hereinafter, the re-grown material layer 110' will be referred to as a 're-grown layer'.

Figure 6C:
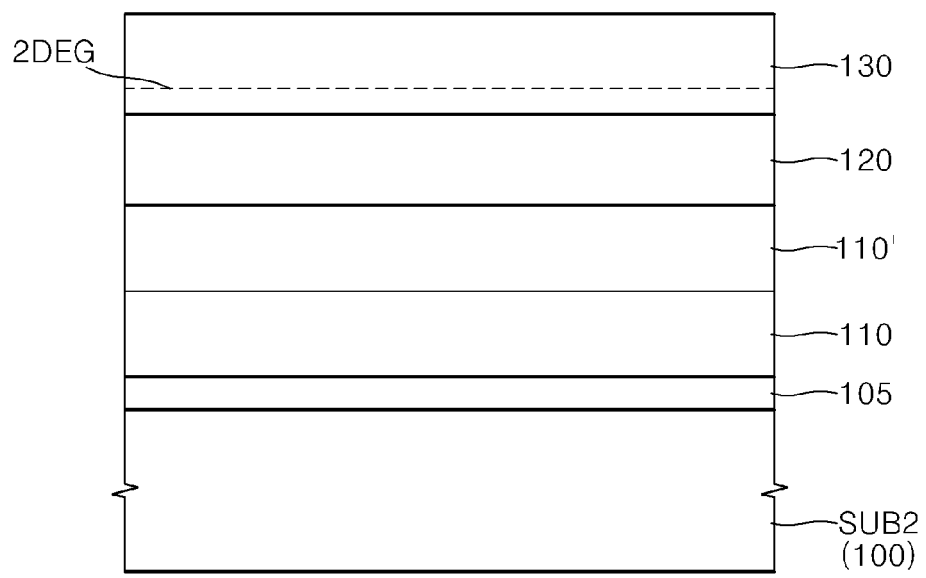

As shown in FIG. 6C, the second layer 120 and the third layer 130 may be sequentially formed on the re-grown layer 110'. Next, although not shown, follow-up operations may be performed on the third layer 130 and a GaN-based semiconductor device may be manufactured.

As shown in FIGS. 6A through 6C, if the first layer 110 is partially removed, the re-grown layer 110' is formed, and the follow-up operations are performed, characteristics of thin-films (GaN-based layers) and the GaN-based semiconductor device may be improved. In detail, the first layer 110 grown on the first substrate SUB1 in the operation shown in FIG. 5A may include a plurality of defects (including dislocations) in the lower portion of the first layer 110. The reason thereof may be insufficient reduction of difference between lattice constants of the first substrate SUB1 and the first layer 110 via the buffer layer 101. If the portion (the lower portion in FIG. 5A, the upper portion in FIG. 5E) of the first layer 110 including a plurality of defects is removed and the re-grown layer 110' (FIG. 6B) is formed thereon, the re-grown layer 110' may have excellent crystallinity. Therefore, crystallinity and characteristics of the second layer 120 and the third layer 130 formed on the re-grown layer 110' may be improved, and thus characteristics of the GaN-based semiconductor device may be improved as a result. In FIGS. 1 through 4, the upper portion of the first layer 110 may correspond to the re-grown layer 110', and thus characteristics of thin-films (GaN-based layers) and the GaN-based semiconductor device shown in FIGS. 1 through 4 may be excellent.

Figure 7:
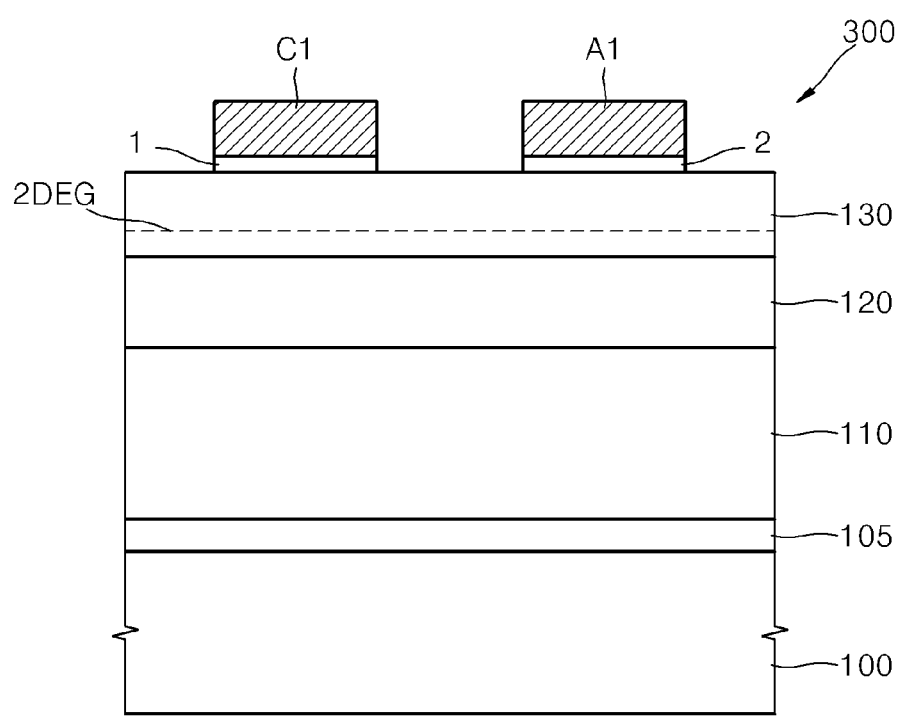
FIG. 7 is a sectional view of a GaN-based semiconductor device according to another embodiment of the present invention.

FIG. 7 shows a GaN-based semiconductor device according to another embodiment of the present invention. The GaN-based semiconductor device according to the present embodiment includes a Schottky diode structure.

Referring to FIG. 7, a Schottky diode device 300 is arranged on a heat dissipation substrate 100. The heat dissipation substrate 100 may be identical to the heat dissipation substrate 100 of FIG. 1. A predetermined bonding layer 105 may be arranged between the heat dissipation substrate 100 and the first layer 110, and the Schottky diode device 300 may be arranged on the bonding layer 105. The bonding layer 105 may be a silicon oxide layer, for example.

The Schottky diode device 300 may include a GaN-based multi-layer, e.g., the first layer 110, the second layer 120, and the third layer 130. The first layer 110, the second layer 120, and the third layer 130 may correspond to the first layer 110, the second layer 120, and the third layer 130 of FIG. 1, respectively. A 2DEG layer may be formed in a portion of the third layer 130 near an interface between the third layer 130 and the second layer 120. The Schottky diode device 300 may include an anode A1 and a cathode C1 that are arranged on the third layer 130. A Schottky contact layer 1 may be arranged between the cathode C1 and the third layer 130, whereas an ohmic contact layer 2 may be arranged between the anode A1 and the third layer 130. The Schottky contact layer 1 and/or the ohmic contact layer 2 may not be arranged according to materials constituting the anode A1 and the cathode C1.

Although not shown, a passivation layer covering the cathode C1 and the anode A1 may be further arranged on the third layer 130. The passivation layer may have a single layer structure or a multi-layer structure including a silicon nitride layer, a silicon oxide layer, etc., for example. Furthermore, a first metal pad layer (not shown) and a second metal pad layer (not shown) respectively contacting the cathode C1 and the anode A1 may be further arranged.

The semiconductor device having the structure as shown in FIG. 7 may be considered as an N-face GaN-based Schottky device arranged on the heat dissipation substrate 100.

Figure 8A:
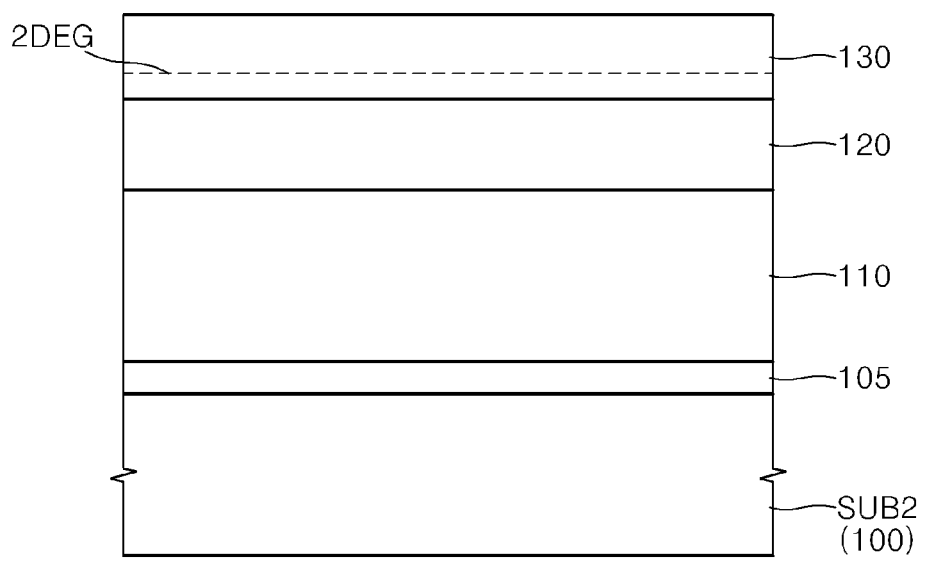
FIGS. 8A and 8B are sectional views showing a method of manufacturing a GaN-based semiconductor device according to another embodiment of the present invention.
Figure 8B:
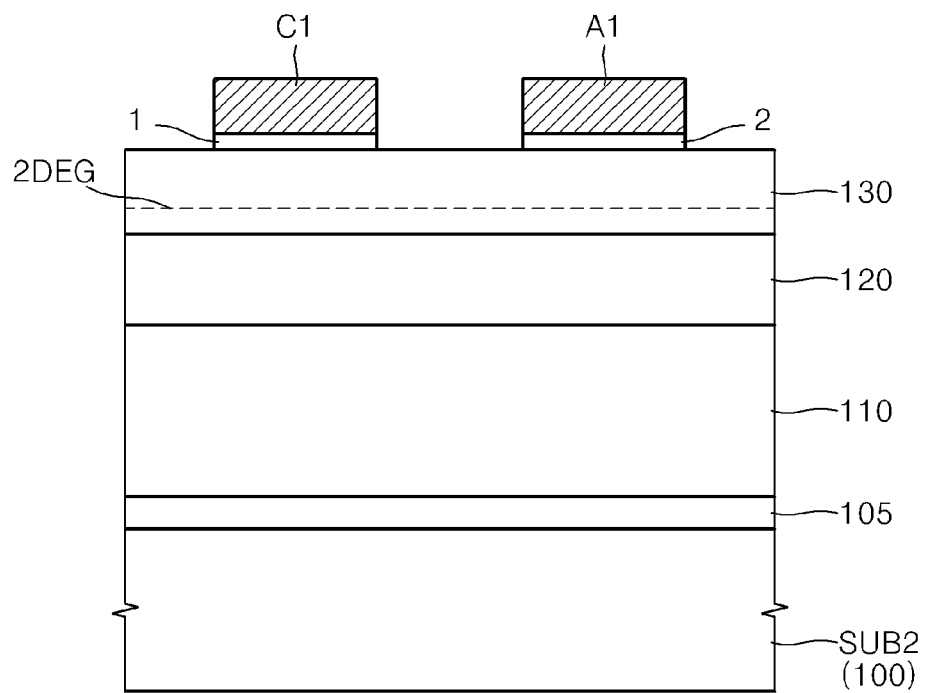

FIGS. 8A and 8B show a method of manufacturing a GaN-based semiconductor device according to another embodiment of the present invention.

Referring to FIG. 8A, by using a method similar to the method of FIGS. 5A through 5F, a stacked structure in which the bonding layer 105, the GaN-based first layer 110, the GaN-based second layer 120, and the GaN-based third layer 130 are sequentially arranged on the second substrate SUB2 may be prepared.

Referring to FIG. 8B, the anode A1 and the cathode C1 may be formed on the third layer 130 to be apart from each other. The Schottky contact layer 1 may be formed between the cathode C1 and the third layer 130, and the ohmic contact layer 2 may be formed between the anode A1 and the third layer 130.

Next, although not shown, a passivation layer covering the anode A1 and the cathode C1 may be formed on the third layer 130. Portions of the passivation layer may be etched to expose the anode A1 and the cathode C1, and a first metal pad layer (not shown) and a second metal pad layer (not shown) respectively contacting the exposed portions of the cathode C1 and the anode A1 may be further formed.

By using the method as described above, an N-face GaN-based Schottky device may be easily manufactured on a heat dissipation substrate (that is, the second substrate SUB2). Various modifications may be made in the manufacturing method shown in FIGS. 8A and 8B similar to the modifications described with reference to FIGS. 5A through 5H.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A gallium nitride (GaN) based semiconductor device, comprising:
   a heat dissipation substrate;
   a GaN-based multi-layer disposed on the heat dissipation substrate, having N-face polarity, and including a 2-dimensional electron gas (2DEG); and
   a gate, a source, and a drain, disposed on the GaN-based multi-layer such that the gate is in Schottky contact with the GaN-based multi-layer and the source and drain are in ohmic contact with the GaN-based multi-layer,
   wherein the GaN-based multi-layer includes:
      an $Al_xGa_{1-x}N$ layer ($0.1 \leq x \leq 0.6$) disposed on the heat dissipation substrate having N-face polarity, and
      an $Al_yGa_{1-y}N$ layer ($0 < y < 0.01$) disposed on the $Al_xGa_{1-x}N$ layer and having N-face polarity,
   wherein the 2DEG is formed in the $Al_yGa_{1-y}N$ layer.

2. The GaN-based semiconductor device of claim 1, wherein the gate has a planar-type structure.

3. The GaN-based semiconductor device of claim 1, wherein the GaN-based multi-layer comprises a double recess region, and the gate is arranged in the double recess region.

4. The GaN-based semiconductor device of claim 1, the heat dissipation substrate comprises a material having a higher thermal conductivity than a sapphire substrate.

5. The GaN-based semiconductor device of claim 4, wherein the heat dissipation substrate is one of an amorphous AlN substrate, a crystalline AlN substrate, a Si substrate, a Ge substrate, an amorphous SiC substrate, and a ceramic substrate.

6. The GaN-based semiconductor device of claim 1, wherein the GaN-based multi-layer further comprises a highly resistive GaN-based material layer disposed between the heat dissipation substrate and the AlxGa1-xN layer.

7. The GaN-based semiconductor device of claim 6, wherein the highly resistive GaN-based material layer has a resistance greater than or equal to $10^9$ Ω/sq.

8. A gallium nitride (GaN) based semiconductor device, comprising:
   a heat dissipation substrate;
   a GaN-based multi-layer disposed on the heat dissipation substrate, having N-face polarity, and including a 2-dimensional electron gas (2DEG); and
   a gate, a source, and a drain, disposed on the GaN-based multi-layer,
   wherein the GaN-based multi-layer comprises:
   a first layer of GaN on the heat dissipation substrate;
   a second layer of $Al_xGa_{1-x}N$ layer ($0.1 \leq x \leq 0.6$) on the first layer; and
   a third layer of $Al_yGa_{1-y}N$ layer ($0 < y < 0.01$) disposed on the second layer,
   wherein the 2DEG is formed in the third layer.

* * * * *